United States Patent [19]

Genies

[11] Patent Number: 4,889,659
[45] Date of Patent: Dec. 26, 1989

[54] NITROGENIZED ELECTRONIC CONDUCTIVE POLYMERS, THEIR PREPARATION PROCESSES, ELECTROCHROMIC DISPLAY CELL AND ELECTROCHEMICAL GENERATOR USING THESE POLYMERS

[75] Inventor: Eugène Genies, St. Egreve, France

[73] Assignee: Commissariat a L'Energie Atomique, Paris, France

[21] Appl. No.: 909,322

[22] Filed: Sep. 19, 1986

[30] Foreign Application Priority Data

Sep. 30, 1985 [FR] France ............................... 85 14451

[51] Int. Cl.$^4$ .............................................. H01B 1/06
[52] U.S. Cl. ..................................... 252/500; 252/518; 528/422; 204/59 R
[58] Field of Search ...................... 252/500, 512, 518; 526/316; 204/59 R, 78; 528/422; 429/212, 213

[56] References Cited

U.S. PATENT DOCUMENTS

| | | | |
|---|---|---|---|
| 4,466,910 | 8/1984 | House et al. ......................... | 252/500 |
| 4,466,911 | 8/1984 | House et al. ......................... | 252/518 |
| 4,505,845 | 3/1985 | House et al. ......................... | 252/518 |
| 4,505,846 | 3/1985 | House et al. ......................... | 252/500 |
| 4,511,492 | 4/1985 | Sweda et al. ......................... | 252/518 |
| 4,629,540 | 12/1986 | Genies ................................ | 204/59 R |
| 4,798,685 | 1/1989 | Yangier ............................... | 528/422 |
| 4,806,271 | 2/1989 | Yangier et al. ...................... | 528/422 |

*Primary Examiner*—Josephine Barr
*Attorney, Agent, or Firm*—Oblon, Spivak, McClelland, Maier & Neustadt

[57] ABSTRACT

Nitrogenized electronic conductive polymers, their preparation processes, electrochromic display cell and electrochemical generators using these polymers.

The polymers according to the invention in reduced form are in accordance with formula $[NH(CH=C-N_n)]_x$, in a first oxidized form with formula $[N(-CH-CH)_nN(-CH=CH)_n]_y$ n and in a second oxidized form with formula $[N(-CH=CH)_n-]_x X^-$, in which n is an integer between 1 and 20, x an integer between 10 and 1,000,000, y an integer between 5 and 500,000 and $X^-$ an anion and in which all or part of the hydrogens carried by the acetylene carbons can optionally be substituted by electron donor or acceptor groups or reactive groups.

These polymers can be used as positive electrode material in an electrochemical generator filled with an electrolyte and having two current collectors, a negative electrode material being constituted by lithium or a lithium-aluminum alloy.

16 Claims, 1 Drawing Sheet

NITROGENIZED ELECTRONIC CONDUCTIVE POLYMERS, THEIR PREPARATION PROCESSES, ELECTROCHROMIC DISPLAY CELL AND ELECTROCHEMICAL GENERATOR USING THESE POLYMERS

BACKGROUND OF THE INVENTION

The present invention relates to novel nitrogenized electronic conductive polymers and to their preparation processes. These polymers are suitable for forming the electrochromic layer of an electrochromic display cell, as well as for forming the active electrode material of an electrochemical generator.

Apart from these specific applications, the conductive polymers according to the invention can be used as components for elements of passive or active electronic circuits, such as electromagnetic shields, as a material for eliminating electrostatic charges, as a matrix or binder used in the composition of composite materials, as a voltaic converter and as an electrode material with specific properties.

As an electrode material, the polymers according to the invention can be used in fuel cells, in analytical chemistry, in chemical and electrochemical catalysis for determining the potential or pH of a solution for protecting against corrosion.

The polymers according to the invention can also be used as gas, water, radiation and similar detectors, as an antiradar shield, or as an ionic gate.

In summarizing, the electronic conductive polymers according to the invention can be used in all fields normally employing conductive materials.

Among the known electronic conductive polymers, two types of materials deserve particular note. The first type relates to polyacetylene and its derivatives and the second type to polyaniline and its derivatives.

Polyacetylene of general formula $(CH)_x$ exists in three forms, namely an undoped, neutral form (I), a p-doped, oxidized form (II) and a n-doped, reduced form (III). These forms can be symbolized by the following chains:

(I) $-CH=CH-CH=CH-CH=CH-CH=CH-$ (II) $=CH-CH=CH-\overset{\oplus}{\underset{\ominus}{CH}}-CH=CH-CH=CH-$  $+X^-$ (III) $=CH-CH=CH-CH-CH=CH-CH=CH-$  $+Y^+$ in which $X^-$ and $Y^+$ respectively represent an anion and a simple or complex cation. As the anion, reference can be made to $ClO_4^-$, $Cl^-$, $Br^-$, $I_3^-$, $FSO_3^-$, $SO_4^{2-}$, $BF_4^-$, $PF_6^-$, etc. and as the cation to $Li^+$, $Na^+$, $K^+$, etc.

Polyacetylene is distinguished by the fact that its structure is constituted by a succesion of single and double carbon -carbon bonds. Due to its relatively simple and in part crystalline structure and its electroactive properties (electrical conductivity of 1000 ohms$^{-1}$cm$^{-1}$) giving rise to numerous applications, considerable significance has been attached to polyacetylene. Unfortunately this material is much too unstable and reactive to give any hope of obtaining time-stable application forms.

Due to its stability, considerable interest has also been attached to polyaniline, which is distinguished by the fact that it can undergo two charge transfer types. It exists in a large number of forms and particularly in an insulating reduced form (1), a first insulating oxidized form (2), which is conductive when protonated, and a second, also conductive, oxidized form (3). These three forms exist in a neutral or basic medium. In the acid medium, other protonated forms exist, but no reference will be made thereto here.

The three forms (1), (2) and (3) are respectively symbolized by the chains:

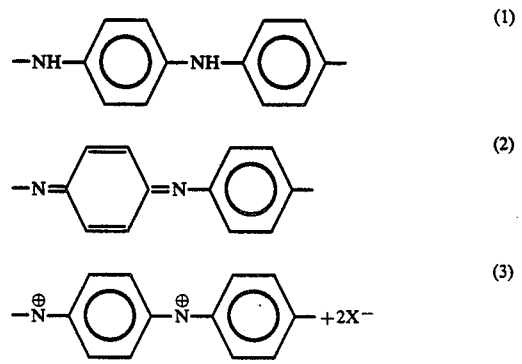

in which $X^-$ represents a single or complex anion. The anion can be $ClO_4^-$, $SO_4^{2-}$, $Cl^-$, $F^-$, $Br^-$, $I^-$, $I_3^-$, $BF_4^-$, $PF_6^-$, $FSO_3^-$ etc.

Form (2) is obtained by oxidizing form (1) leading to the removal of an electron and a $H^+$ by a nitrogen atom. In the same way, form (3) is obtained by oxidation of form (1) leading to the removal of an electron by a nitrogen atom. Form (3) should be called phenylene polynitrenium.

Polyanaline is a conductive polymer with a very high mass capacity. Experimentally the measured mass capacity is close to 150 Ah/kg. Unfortunately, its electrical conductivity of 1 to 10 ohms$^{-1}$cm$^{-1}$ is relatively low, which limits its applications.

SUMMARY OF THE INVENTION

The object of the present invention is to provide nitrogenized electronic conductive polymers of a novel type combining the properties of polyacetylene and polyaniline. In particular, these polymers have a high mass capacity and very good electrical conductivity. Moreover, these polymers are stable and not very reactive, so that they can be used in a large number of time-stable application forms.

More specifically, the present invention relates a nitrogenized electronic conductive polymer wherein in the reduced form A it has the formula:

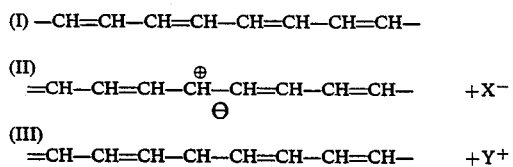

in a first oxidized form B the formula:

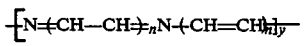

and in a second oxidized form C the formula:

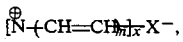

in which n, x and y are integers such that $1 \leq n \leq 20$, $10 \leq x \leq 1{,}000{,}000$ and $5 \leq y \leq 500{,}000$, $X^-$ represents a simple or compex anion and in which all or part of the hydrogens carried by the carbons of the polymer are optionally substituted.

Hereinafter, the carbons belonging to the chain $-(CH=CH)_n$- or $-(CH-CH)_n$- of forms A, B and C of the polymers according to the invention will be called acetylene carbons.

Form A corresponds to an acetylene polyamine, form B to an acetylene polyimine and form C to an acetylene polynitrenium. By successive oxidations it is possible to pass from form A to form B (removal of a e$^-$ and a H$^+$ by N) and then to form C (removal of a e$^-$ by N). Conversely, by successive reductions it is possible to pass from form C to form B and then to form A.

The exact composition of these conductive polymers is dependent on the envisaged applications. In particular, the advantageous addition of an oxidation reduction and/or photosensitive radical makes it possible to use the conductive polymers according to the invention as an electrode material or as a photovoltaic converter.

The oxidation reduction radical can be constituted by a large number of complexes of transition metals, such as ferrocene or viologens. The photosensitive radical can be a quinone, an anthraquinone and derivatives thereof.

Other transition metal complexes such as porphyrins, phthalocyanins, hemoglobin, chlorophyll and derivatives thereof, offering both oxidation reduction and photosensitive properties, can be used.

Preferably, the hydrogens carried by the acetylene carbons of the polymers according to the invention are wholly or partly substituted by a halogen, a straight-chain or branched alkyl radical or an optionally substituted aryl radical, a group chosen from among:

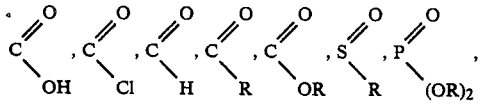

SO$_2$R, SR, OR, with R being a straight-chained or branched alkyl radical, or an optionally substituted aryl radical and from among OH, NO$_2$, NH$_2$, CF$_3$, SO$_2$, CN, SCN, OCN.

The halogen used can be fluorine, bromine, chlorine or iodine.

The alkyl radicals substituting all or part of the hydrogens carried by the acetylene carbons of the polymers and the alkyl radical R of the substituents of these hydrogens have 1 to 100 carbon atoms. The alkyl radicals which can be used are e.g. methyl, ethyl, n-propyl, isopropyl, n-butyl, isobutyl, n-pentyl and similar radicals.

Optionally, the alkyl radicals substituting hydrogens carried by the acetylene carbons of the polymers can be partly or wholly substituted by a group chosen from among:

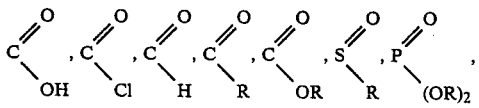

SO$_2$R, SR, OR, with R being a straight-chained or branched alkyl radical, or an optionally substituted aryl radical and from among OH, NO$_2$, NH$_2$, CF$_3$, SO$_2$, CN, SCN, OCN.

In the same way, the aryl radicals substituting all or part of the hydrogens carried by the acetylene carbons of the polymers and as the aryl radical R of the substituents of these hydrogens which can be used, reference can be made to benzene, naphthalene and anthracene radicals.

Optionally the aryl radicals substituting the hydrogens carried by the acetylene carbons can be substituted. The substituent can be the same as those of the substituted alkyl radicals.

In preferred manner, when the polymer according to the invention is in the form of acetylene polynitrenium or in the form of protonated acetylene polyimine, the anion X$^-$ can e.g. be Cl$^-$, HSO$_4^-$, BF$_4^-$, SO$_3$F$^-$, Br$^-$, F$^-$, I$^-$, ClO$_4^-$, H$_2$PO$_4^-$, SO$_4^{2-}$, PF$_6^-$, (S$_p$)$^2$ with $1 \leq p \leq 10$, or a polyanion such as Nafion, etc.

The electronic conductive polymer according to the invention corresponding to n=1 is vinyl polyamine, which in the reduced form A is of formula:

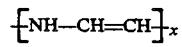

in the first oxidized form B of formula:

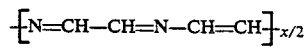

and in the second oxidized form C of formula:

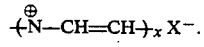

Anion X$^-$ can be one of those referred to hereinbefore. In particular, x can vary between 10 and 1,000,000 and is e.g. 100.

It is necessary not to confuse the polyamine vinyl, the polymer according to the invention, with polyvinyl amine of formula $-[C(NH_2)=CH]_z$ analogus to polyvinyl chloride (PVC), z being an integer.

Another electronic conductive polymer according to the invention having a relatively simple structure corresponding to n=2 is the polybutadiene polymer, which in the reduced form A is of formula:

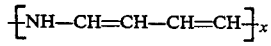

in the first oxidized form B is of formula:

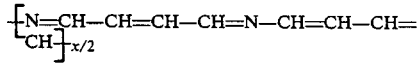

and in the second oxidized form C of formula:

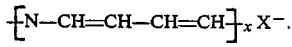

In particular, x can vary between 10 and 50,000 and is e.g. 50. The X$^-$ anion can be one of those referred to hereinbefore.

Another conductive polymer according to the invention is hexatriene polyamine corresponding to n=3, which in the reduced form A is of formula:

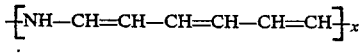

in the first oxidized form B is of formula:

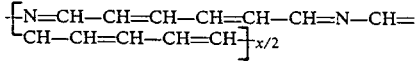

and in the third oxidized form C is of formula:

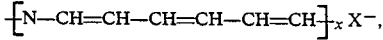

whereby x can vary between 2 and 20,000 and is e.g. 20. The $X^-$ anion is e.g. one of these referred to hereinbefore.

It can be gathered from the three aforementioned polymer compounds that the structure of the electronic nitrogenized conductive polymers according to the invention is constituted by a succession of carbon - carbon single and double bonds, such as polyacetylene. It is the existence of these carbon -carbon double bonds which gives the conductive polymers according to the invention an electrical conductivity higher than that of polyanilines. Conversely, the presence of nitrogen atoms interrupting the carbon chain of the polymers ensures that they have a good stability.

The invention also relates to a first process for the preparation of a nitrogenized electronic conductive polymer like that described hereinbefore. This first process is characterized in that oxidation takes place in a liquid medium of a monomer of formula $NH_2\text{-}(CH=CH)_n\text{-}H$, n being an integer such that $1 \leq n \leq 20$, in which all or part of the hydrogens carried by the carbons are optionally substituted. It makes it possible to obtain polymers according to the invention in their oxidized form C.

The possible substituents of the hydrogens carried by the acetylene carbons of the monomer to be oxidized are in particular those described hereinbefore during the definition of the polymers according to the invention.

The liquid medium oxidation preferably takes place in a highly acid medium, i.e. in a medium containing an acid or an acid mixture, whereof the equivalent pH is advantageously below 0 by reference to water, such as e.g. sulphuric, phosphoric, hydrofluoric, benzenesulphonic, hydrochloric, tetrafluoroboric, hexafluorophosphoric, fluorosulphuric or chlorosulphuric acids.

For the polymers according to the invention corresponding to $n=1$, i.e. vinylamine, the monomer of formula $NH_2\text{-}(CH=CH)\text{-}H$, and its simple derivatives formation can take place by oxidation of the corresponding saturated amine in a highly acid liquid medium. In particular, the vinyl polyamine (PVA) can be directly formed from ethylamine, because during the oxidation process the latter will firstly be oxidized into vinlyamine.

The oxidation in the particularly acid liquid medium according to the invention advantageously takes place in a fluoride-rich medium. In particular, it is possible to use $RNH_2$, HF mixtures with R representing an alkyl radical, prydine, HF mixtures, or $NH_4F$, $\alpha HF$ mixtures, with $\alpha$ between 1 and 4. In particular $\alpha$ equals 2.35, which corresponds to the $NH_3$, HF eutectic containing approximately 54.2% of free HF and 80.9% of total HF (by weight). This eutectic solution will hereinafter be called N bath.

It is possible to replace the fluoride-rich acid medium by another acid medium. The acids which can be used are those given hereinbefore. Moreover, oxidation can also take place in an organic solvent such as acetonitrile, nitromethane, nitrobenzene, benzonitrile or polyanion solutions such as Nafion.

The oxidation of the acetylamine (monomer of formula $NH_2\text{-}(CH=CH)_n\text{-}H$ with $1 \leq n \leq 20$) in the liquid medium can be carried out either chemically or electrochemically. The chemical method involves the use of oxidizing agents such as potassium dichromate, potassium permanganate, hydrogen peroxide and other peroxides, osmium tetroxide, ammonium persulfate, which are dissolved or suspended in the aforementioned liquid medium.

In the electrochemical method, the polymers according to the invention are electrolytically deposited on a support such as platinum, nickel, monel (Ni-Cu alloy), carbon or any other carbon-coated material support, such as e.g. a stainless steel support covered with a graphite paint. The current densities used for this electrochemical deposition vary between 0.05 and 100 $mA/cm^2$. The solvents can be the same as hereinbefore in the presence of salts such as $LiClO_4$, $LiBF_4$, $LiPF_6$. Nafion solutions can also be used. It is also possible to use a conductive support covered with conventional polymers, such as polyesters, polyamides, etc. in order to obtain a composite material.

This procedure of oxidizing the polymers according to the invention when it is wished to use them as an active electrode material in an electrochemical generator or battery, makes it possible to directly obtain the electrode of said generator.

The conductive polymers according to the invention prepared by the process described hereinbefore have electrochemical properties far superior to a large number of other known conjugate conductive polymers. Thus, after 1600 complete charging and discharging cycles, the battery based on polymers according to the invention still retains 80% of its capacity, whereas other polymers, e.g. polypyrrole and polyacetylene lose 20% of their capacity after 100 cycles.

The preparation process described hereinbefore, particularly in connection with the preparation of polyanilines has been described in FR-A-2 545 494 published on Nov. 9 1984.

The electronic conductive polymers according to the invention can be obtained by a second preparation process, which is characterized by reacting in an organic solvent an alkaline earth or alkali metal on a compound of formula $NH_2\text{-}(CH=CH)_n\text{-}Z$, n being an integer such that $1 \leq n \leq 20$ and Z is a halogen, in which all or part of the hydrogens carried by the carbons are optionally substituted. It makes it possible to obtain polymers according to the invention in their reduced form A.

With regards to the possible substituents of the hydrogens carried by the acetylene carbons of the halogenated monomer, it is possible to use the same ones as given hereinbefore during the definition of the polymers according to the invention. The halogen Z can be constituted by chlorine, bromine or iodine.

The alkaline earth or alkali metals usable are e.g. lithium, sodium, potassium, beryllium, magnesium, calcium, etc.

The reaction of the lithium on an acetylene amine having in opposition to the $NH_2$ function a hydrogen substituted by a halogen Z is as follows:

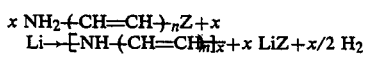

The action of the alkaline earth or alkali metal on the monomer substituted by a halogen is realized in an organic solvent. The solvent can be dimethylsulphoxide (DMSO), tetrahydrofuran (THF), hexamethylphosphotriamine (HMPT), ethers, including ethyl ether and the like.

The inventive polymers prepared according to this second process have the same electrochemical properties as those obtained by the first process.

The polymers according to the invention can be obtained by a third preparation process, which is characterized by the copolymerization by polycondensation in an aqueous or non-aqueous solvent of a diamine of formula $NH_2\!-\!(CH\!=\!CH)_n\!-\!NH_2$ with a dialdehyde of formula $CHO\!-\!(CH\!=\!CH)_{n-1}\!CHO$, n being an integer such that $1 \leq n \leq 20$, in which all or part of the hydrogens carried by the carbons are optionally substituted. This process makes it possible to obtain inventive polymers in their oxidized form B.

The possible substituents of the hydrogens carried by the acetylene carbons of the diamine and the dialdehyde which can be used are those described hereinbefore during the definition of the polymers according to the invention.

The inventive polycondensation of a diamine and a dialdehyde can be symbolized in the following way:

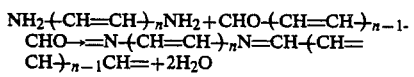

It can be gathered from the above equation that the reaction of a dialdehyde on a diamine takes place molewise.

This reaction is performed in an aqueous or non-aqueous solvent, e.g. water, acetonitrile, acetone, an alcohol such as ethanol, butanol, propanol, or a water-alcohol mixture.

The inventive polymers prepared according to this third process have the same electrochemical properties as those obtained by the preceding processes.

The conductive polymers directly obtained by the three aforementioned processes can be modified in order to fix them by means of an oxidation reduction and/or photosensitive radical as a function of the intended applications of said polymers.

The addition of these radicals can be carried out by performing, with the aid of fuming nitric acid, a partial nitration of the polymers and then by reducing the $NO_2$ group or groups formed into a $NH_2$ group in the presence of tin and hydrochloric acid. On the $NH_2$ group or groups formed is then reacted an acid chloride of formula

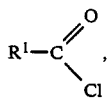

in which $R^1$ corresponds to the oxidation reduction and/or photosensitive radical which it is wished to fix to the polymers. In particular, $R^1$ represents a complex of a transition metal, such as ferrocene and viologens, or a quinone, anthraquinone, etc.

With regards to the polymers according to the invention, whereof all or part of the hydrogens carried by the carbons of the acetylene chain is substituted, these polymers can be obtained either by substituting one of the two hydrogens or the two hydrogens of one of the acetylene functions of the corresponding monomer, or by substituting one or more hydrogens of the hydrogenated polymers obtained after polymerization according to the three aforementioned processes. This latter possibility is realized in the same way as for fixing an oxidation reduction and/or photosensitive radical.

The invention also relates to an electrochromic display cell which, in a transparent tight container, has an electrochromic layer immersed in an electrolyte positioned between an electrode having an appropriate shape for display purposes and a counterelectrode, which is characterized in that the electrochromic layer is a thin film of a polymer according to the invention, which covers the electrode.

An important advantage of the electrochromic layers formed from conductive polymers according to the invention when compared with liquid crystals is based on the existence of a greater contrast under a high angle of incidence and therefore easier reading. Moreover, these polymers are very stable, which is not the case with certain liquid crystals.

The electrolyte usable in a display cell according to the invention can be constituted by fluoride-rich acid media and in particular the eutectic $NH_3$, $HF$ (N bath) or mineral acids containing one of their salts. It is e.g. possible to use a hydrochloric acid solution at pH 0 containing 1 mol/l of NaCl or KCl, a sulphuric acid solution at pH 0 containing 1 mol/l of $Na_2SO_4$, a tetrafluoroboric acid solution at pH 0 containing 1 mol/l of $NaBF_4$, or a fluorosulphuric solution containing 1 mol/l of $NaSO_3F$. Another electrolyte which can be used is an organic solution of acetonitrile, nitromethane or benzonitrile containing 1 mol/l of lithium perchlorate, or an ionic conductive polymer such as polyethylene oxide (POE) or propylene, containing $LiClO_4$.

In view of the corrosiveness of certain electrolytes and particularly fluoride-rich acid media (particularly N bath) it is preferable to deposit, e.g. by electrochemical oxidation, the electrochromic polymer film according to the invention on a transparent plastic substrate, whose surface has been made conductive by the prior deposition of a conductive layer constituting the display electrode. This plastic substrate is itself deposited on a rigid, transparent, mineral support, such as glass, forming the walls of the tight container. The plastic substrate can be of a polyester, polycarbonate, polypropylene, teflon, neoprenes, etc. The plastic film thickness can vary between 5 μm and a few mm.

The electrodes and counterelectrodes can be made from one of the following materials gold, platinum, silicon, nickel, indium and/or tin oxide, the thickness thereof ranging between 10 and 300 nm.

The invention also relates to an electrochemical generator provided, in a tight container, with a first current collector covered with a positive active material, a second current collector covered by a negative active material, the active materials being immersed in an electrolyte, wherein one of the active materials is formed from a layer of a polymer according to the invention covering the electrode.

The layer can either be a thin film, or a compressed pellet containing carbon black. The polymer pellet can be produced from a viscous paste of said polymer and carbon black which is compressed.

The electronic conductive polymer pellet or film according to the invention advantageously forms the positive active material of the electrode. However, the polymers according to the invention could also constitute the negative active material of the electrode.

When the polymers according to the invention constitute the positive active material of the electrode, the negative active material thereof can be constituted by a reactive metal, such as lithium or zinc, by an alloy and in particular lithium and aluminium, by a conjugate conductive polymer, by carbon or by a composite material. Preference is given to the use of a reactive metal, such as lithium or zinc, as well as to lithium-aluminium alloys.

The electrolytes associated with the aforementioned electrodes are preferably lithium salts, such as fluoride, chloride, perchlorate, perborate, persulphate or hexafluorophosphate. Nevertheless, it is possible to use sodium hexafluorophosphate, tetramethylammonium fluoroborate, tetramethylammonium chloride, tetramethylammonium fluoride or tetrabutylammonium fluoride.

These electrolytes are in particular dissolved in an organic solvent, such as e.g. linear ethers, such as dimethoxyethane, cyclic ethers, dioxolan or methylhydrofurans, or esters such as propylene carbonate.

When an aqueous medium is used as the electrolyte solvent, it is advantageous to use solutions having a pH below 5 with various electrolytes. The solution can be a sulphuric acid solution containing $Na_2SO_4$, a tetrafluoroboric acid solution containing $NaBF_4$, a phosphoric acid solution containing $Na_3PO_4$ and in particular the electrolyte can be a hydrochloric acid solution containing 1 mol/1 of zinc chloride, when using it as the negative electrode material of the zinc.

One of the advantages of producing the negative or positive active electrode material of an electrochemical battery or generator with polymers according to the invention is based on the good mass capacity thereof. In the case of vinyl polyamine (PVA) according to the invention, the mass capacity of the material, if it is accepted that an electron is exchanged by $C_2H_2N$ with the ions $H_3O^+$ and $F^-$ or $ClO_4^-$ of the electrolyte, is respectively 344 and 169 Ah/kg. The same calculation for polyaniline respectively gives 200 and 129 Ah/kg.

As the mass capacity of polyaniline is close to 150 Ah/kg, using the vinyl polyamine according to the invention it is possible to obtain mass capacities close to 200 Ah/kg which constitutes a considerable improvement compared with the aforementioned conductive polymers.

BRIEF DESCRIPTION OF THE DRAWINGS

The invention is described in greater detail hereinafter and in an illustrative and non-limitative manner with reference to the attached drawings, wherein show.

DETAILED DESCRIPTION OF THE INVENTION

Figure 1:
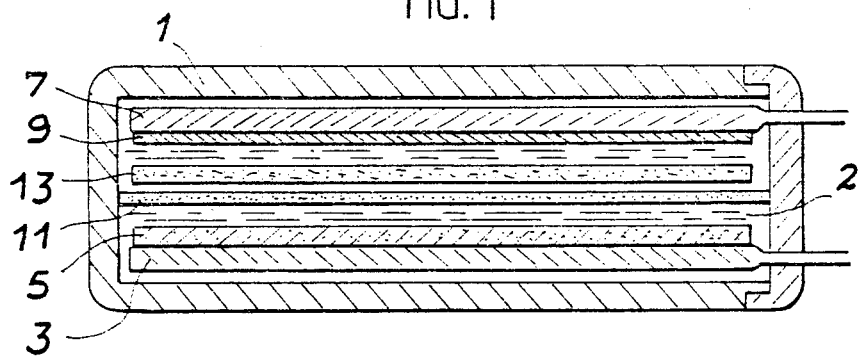
FIG. 1 In section, an electrochemical generator having an electrode with a conductive polymer according to the invention.

FIG. 1 shows in section an embodiment of an electrochemical generator or battery according to the invention. This generator comprises a tight, insulating box 1, which is in particular of polyethylene, which contains an electrolyte 2. The latter is formed from a molar solution of lithium perchlorate dissolved in propylene carbonate.

In this electrolyte are placed a first current collector 3 covered with a positive active material 5 and a second current collector 7 in contact with a negative active material 9. These collectors 3, 7 are in the form of grids or plates.

The first collector 3 constituted by a carbon electrode is covered with a vinyl polyamine layer (PVA) of thickness 0.5 mm, deposited by electrochemical oxidation in the aforementioned N bath, which constitutes the positive active material. The second stainless steel collector 7 is covered e.g. by electrolysis with a layer 9 of lithium or a lithium-aluminium alloy and this serves as the negative active material.

Separators 11, 13 can be provided to prevent short-circuiting. In particular, separator 11 is constituted by a Nafion 11 membrane or diaphragm and separator 13 by a mineral fibre fabric. However, the separators can also be constituted by other ion exchange membranes, microporous teflon, cellulose films, specially treated paper, glasswool, polymer membranes, e.g. of polyethylene or polypropylene.

According to the invention the lithium layer 9 can be replaced by a zinc layer and in this case it is preferable for the electrolyte to be constituted by an aqueous zinc chloride solution with a pH below 4, the acidity being due to the hydrochloric acid.

Several unitary electrochemical batteries or generators can be used and they are interconnected in series or parallel.

Figure 2:
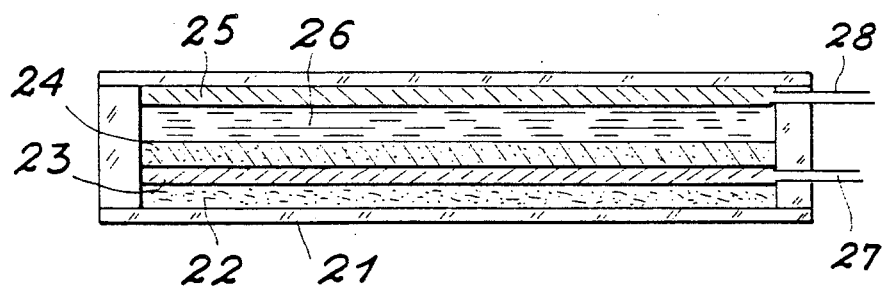
FIG. 2 In section, an electrochromic display cell having an electrochromic layer of a conductive polymer according to the invention.

FIG. 2 shows in section an electrochromic display cell according to the invention. This cell comprise a transparent insulating container 21, e.g. of glass, in which is contained a polyester support 22 covered with a display-suitable electrode 23, which is in particular formed from a thin gold film of approximately 10 nm. On the surface of the gold film 23 is located a roughly 0.5 $\mu$m vinyl polyamine electrochromic layer 24, prepared in the manner described hereinbefore by electropolymerization in a N bath. Container 21 also contains a platinum counter electrode 25 and an electrolyte 26, e.g. formed from an organic acetonitrile solution containing 1 mol/1 of lithium perchlorate or a N bath. Conductors 27, 28 make it possible to supply electric current to the electrochromic cell and to vary the degree of oxidation or reduction of the polymer electrochromic film, in order to change its colour.

The applications of the conductive polymers according to the invention have clearly only been given in an illustrative manner and numerous other applications can be envisaged.

A description will now be given relative to a number of examples of processes for the preparation of conductive polymers according to the invention and which are in particular usable as a positive electrode mass in an electrochemical generator as described hereinbefore.

EXAMPLE 1

Firstly 100 cc of N bath containing 54.2% of free HF and 80.9% of total HF by weight is prepared and this is saturated by vinyl amine bubbling. Accompanied by the vigorous stirring of the bath, there is a slow addition of 5 g of potassium bichromate in small fractions for 5 minutes. Stirring is continued for 30 minutes. The mixture obtained is then diluted with water, filtered, washed with water and then acetonitrile and finally dried at 25° C. 2.3 g of a black acetylene polynitrenium powder is collected (form C), the anions being constituted by $F^-$ ions of the N bath. This powder can be used as the positive active mass of a battery having a potential of 2.8 V relative to a lithium-aluminium negative electrode material.

EXAMPLE 2

In the same N bath as for example 1 is dissolved by bubbling 5 ml of hexatriene polynitrenium (form C). This powder can also be used as the positive active mass for a battery. It has a potential of 3.1 V relative to a lithium-aluminium negative electrode material.

EXAMPLE 3

On a carbon electrode is electrochemically deposited a vinyl polyamine film (form C) with a thickness of approximately 100 μm. This film was obtained in a reactor in which had been introduced 50 cc of bath N saturated with vinylamine by bubbling. In the bath was placed a carbon electrode of 40 cm² facing a nickel electrode and a constant current of 1 mA/cm² was applied for 1 hour. The carbon anode became intensely black as a result of the deposition of 75 mg of vinyl polyamine. The deposit obtained was then washed with water, acetone and then propylene carbonate and dried at 25° C. The thus obtained deposit can be directly used as the positive active mass of a battery.

EXAMPLE 4

In the same way as in example 3 electrochemical deposition took place of a hexatriene polyamine film (form C) with a thickness of approximately 100 μm on a carbon electrode. This film was obtained under the same conditions as in example 3 with 50 cc of N bath, to which was added 0.5 cc of hexatrienamine. The deposit obtained of 81 mg of hexatriene polyamine, following washing, filtering and drying as in example 3, can be directly used as the positive active mass of a battery.

EXAMPLE 5

In 100 cc of tetrahydrofuran (THF), 2 g of lithium are allowed to act on 10 g of monobromine derivative of vinlylamine of formula Br—CH=CH—NH₂ for 30 minutes. Following washing with water, filtering, washing with acetonitrile and drying, 1.5 g of vinlyl polyamine is obtained (form A).

EXAMPLE 6

In the same way as in example 5, in 100 cc of THF are reacted 2 g of lithium on 8 g of a monobromine derivative of hexatrielamine. 2.1 g of hexatriene polyamine (form A) are obtained after washing, filtering and drying.

EXAMPLE 7

In 100 cc of acetonitrile, 1 g of 1,2-diaminoethylene is reacted with 2 cc of a 40% by volume glyoxal solution in water. This gives a precipitate, which is washed with water, filtered, washed with acetonitrile and then dried at 25° C. This gives 1.5 g of an acetylene polyimine powder (form B).

What is claimed is:

1. A nitrogenized electronic conductive polymer, having in the reduced form A the formula:

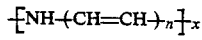

in a first oxidized form B the formula:

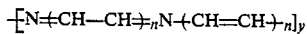

and in a second oxidized form C the formula:

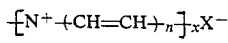

wherein n, x and y are integers such that $1 \leq n \leq 20$, and $10 \leq x \leq 1,000,000$ and $5 \leq y \leq 500,000$, and $X^-$ is an anion selected from the group consisting of $Cl^-$, $HSO_4^-$, $BF_4^-$, $SO_3F^-$, $Br^-$, $F^-$, $I^-$, $ClO_4^-$, $H_2PO_4^-$, $SO_4^{-2}$, $PF_6^-$, $S^{-2}$, $(Sp)^{-2}$, wherein $1 \leq p \leq 10$, and a perfluorosulfonic acid polyanion; and wherein the hydrogens attached to the polymer carbon atoms are unsubstituted or substituted by halogen; a group selected from the groups consisting of —CO₂H, —COCl, —CHO,

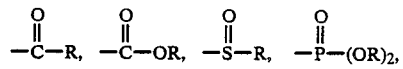

—SO₂R, —SR, —OR, —OH, —NO₂, —NH₂, —CF₃, —SO₂, —CN, —SCN and —OCN, wherein R is as defined hereinafter; a straight-chain or branched-chain alkyl group of 1 to about 100 carbon atoms, which alkyl groups are unsubstituted or substituted by the groups: —CO₂H, —COCl, —CHO,

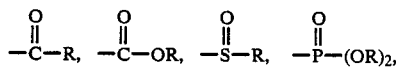

—SO₂R, —SR, —OR, —OH, —NO₂, —NH₂, —CF₃, —SO₂, —CN, —SCN and —OCN, wherein R is an alkyl group of 1 to about 100 carbon atoms; or an aryl radical selected from the group consisting of benzene, naphthalene and anthracene radicals which are unsubstituted or substituted with the same substituents as defined above for the alkyl groups attached to the polymer carbon atoms.

2. The polymer according to claim 1, comprising an oxidation-reduction or photosensitive radical or both.

3. The polymer according to claim 1, wherein the reduced form A has the formula:

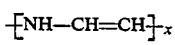

the first oxidized form B has the formula:

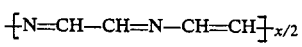

and the second oxidized form C has the formula:

4. The polymer according to claim 1, wherein the reduced form A has the formula:

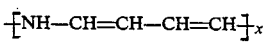

the first oxidized form B has the formula:

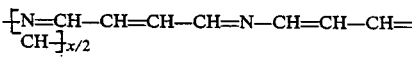

and the second oxidized form C has the formula:

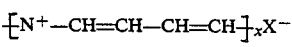

5. The polymer according to claim 1, wherein the reduced form A has the formula:

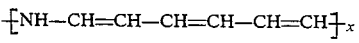

the first oxidized form B has the formula:

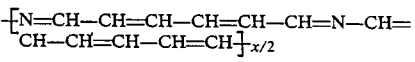

and the third oxidized form C has the formula:

$$-\text{N}^+-\text{CH}=\text{CH}-\text{CH}=\text{CH}-\text{CH}=\text{CH}-_x\text{X}^-$$

6. The polymer according to claim 2, wherein the radical is selected from the group consisting of a transition metal complex, a quinone or a derivative thereof, an anthraquinone or a derivative thereof.

7. A process for the preparation of a nitrogenized electronic conductive polymer, which comprises oxidizing in an acidic liquid medium or an organic solvent medium, a monomer of the formula: $\text{NH}_2-\text{CH}=\text{CH})_n\text{H}$, n being an integer such that $1 \leq n \leq 20$, and wherein said organic solvent is selected from the group consisting of acetonitrile, nitromethane, nitrobenzene, benzonitrile and polyanionic perfluorosulfonic acid, and wherein the hydrogens attached to the polymer carbon atoms are unsubstituted or substituted by halogens; a group selected from the groups consisting of —CO₂H, —COCl, —CHO,

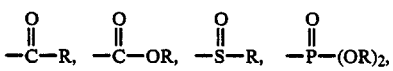

—SO₂R, —SR, —OR, —OH, —NO₂, —NH₂, —CF₃, —SO₂, —CN, —SCN, and —OCN, wherein R is as defined hereinafter; a straight-chain or branched-chain alkyl group of 1 to about 100 carbon atoms, which alkyl groups are unsubstituted or substituted by the groups: —CO₂H, —COCl, —CHO,

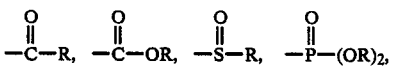

—SO₂R, —SR, —OR, —OH, —NO₂, —NH₂, —CF₃, —SO₂, —CN, —SCN and —OCN, wherein R is an alkyl group of 1 to about 100 carbon atoms; or an aryl radical selected from the group consisting of benzene, naphthalene and anthracene radicals which are unsubstituted or substituted with the same substituents as defined above for the alkyl groups attached to the polymer carbon atoms.

8. A process for the preparation of a nitrogenized electronic conductive polymer, which comprises reacting in an organic solvent an alkaline earth metal or alkaline metal and a compound of the formula $\text{NH}_2-(\text{CH}=\text{CH})_n\text{Z}$, n being an integer of such that $1 \leq n \leq 20$ and Z is a halogen, and wherein the hydrogens attached to the polymer carbon atoms are unsubstituted or substituted by halogen; a group selected from the groups consisting of —CO₂H, —COCl, —CHO,

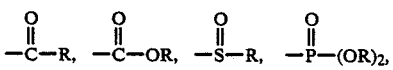

—SO₂R, —SR, —OR, —OH, —NO₂, —NH₂, —CF₃, —SO₂, —CN, —SCN and —OCN, wherein R is as defined below; a straight-chain or branched-chain alkyl group of 1 to about 100 carbon atoms, which alkyl groups are unsubstituted or substituted by the groups: —CO₂H, —COCl, —CHO,

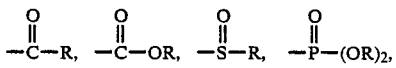

—SO₂R, —SR, —OR, —OH, —NO₂, —NH₂, —CF₃, —SO₂, —CN, —SCN and —OCN, wherein R is an alkyl group of 1 to about 100 carbon atoms; or an aryl radical selected from the group consisting of benzene, naphthalene and anthracene radicals which are unsubstituted or substituted with the same substituents as defined above for the alkyl groups attached to the polymer carbon atoms.

9. A process for the preparation of a nitrogenized electronic conductive polymer, which comprises copolymerizing, by polycondensation in an aqueous or non-aqueous solvent, a diamine of the formula $-\text{NH}_2-(\text{CH}=\text{CH})_n\text{NH}_2$ and a dialdehyde of the formula $\text{CHO}-(\text{CH}=\text{CH})_{n-1}\text{CHO}$, n being an integer such that $1 \leq n \leq 20$, and wherein the hydrogens attached to the polymer carbon atoms are unsubstituted or substituted by halogens; a group selected from the group consisting of —CO₂H, —COCl, —CHO,

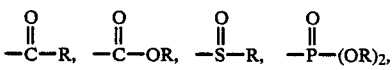

—SO₂R, —SR, —OR, —OH, —NO₂, —NH₂, —CF₃, —SO₂, —CN, —SCN and —OCN; wherein R is as defined hereafter; a straight-chain or branched-chain alkyl group of 1 to about 100 carbon atoms, which alkyl groups are unsubstituted or substituted by the groups: —CO₂H, —COCl, —CHO,

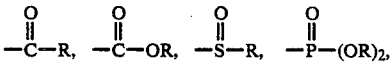

—SO₂R, —SR, —OR, —OH, —NO₂, —NH₂, —CF₃, —SO₂, —CN, —SCN and —OCN, wherein R is an alkyl group of 1 to about 100 carbon atoms; or an aryl radical selected from the group consisting of benzene, naphthalene and anthracene radicals which are unsubstituted or substituted with the same substituents as defined above for the alkyl groups attached to the polymer carbon atoms.

10. The process according to claim 7, wherein n is 1, and the monomer is formed by oxidation in a liquid medium of ethylamine or a derivative thereof.

11. The process according to claim 7, wherein the liquid medium is a fluoride-rich acid medium.

12. The process according to claim 7, wherein oxidation is effected chemically or electrochemically.

13. The process according to claim 8, wherein the solvent is selected from the group consisting of dimethylsulfoxide, tetrahydrofuran, hexamethylphosphotriamine and ethyl ether.

14. The process according to claim 7, wherein an oxidation-reduction or photosensitive radical is fixed after polymerization.

15. The polymers according to claim 4, wherein x has a value between 10 and 50,000.

16. The polymer according to claim 5, wherein x has a value of up to about 20,000.

* * * * *